United States Patent
Ho et al.

(10) Patent No.: US 11,233,022 B2
(45) Date of Patent: Jan. 25, 2022

(54) ELECTRICAL CONNECTION PLACEMENT OF SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Cheng-Lin Ho, Kaohsiung (TW); Chih-Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 10 days.

(21) Appl. No.: 16/735,002

(22) Filed: Jan. 6, 2020

(65) Prior Publication Data
US 2021/0210446 A1  Jul. 8, 2021

(51) Int. Cl.
*H01L 23/00* (2006.01)

(52) U.S. Cl.
CPC ............. *H01L 24/05* (2013.01); *H01L 24/03* (2013.01); *H01L 2224/02311* (2013.01); *H01L 2224/02331* (2013.01); *H01L 2224/03462* (2013.01); *H01L 2224/0401* (2013.01); *H01L 2224/05548* (2013.01); *H01L 2224/05556* (2013.01)

(58) Field of Classification Search
CPC ........... H01L 2224/05548; H01L 24/05; H01L 24/03; H01L 2224/0401; H01L 2224/02331; H01L 2224/03462
See application file for complete search history.

(56) References Cited

U.S. PATENT DOCUMENTS

2019/0103353 A1* 4/2019 Liu .................. H01L 24/32
2019/0131231 A1* 5/2019 Lu .................... H01L 23/481

* cited by examiner

*Primary Examiner* — Sonya McCall-Shepard
(74) *Attorney, Agent, or Firm* — Foley & Lardner LLP

(57) ABSTRACT

A semiconductor device package includes a redistribution structure and an electrical connection. The redistribution structure has an electrical terminal adjacent to a surface of the redistribution structure and a seed layer covering a side surface of the electrical terminal. The electrical connection is disposed on a first surface of the electrical terminal. The seed layer extends to the first surface of the electrical terminal.

16 Claims, 21 Drawing Sheets

ELECTRICAL CONNECTION PLACEMENT OF SEMICONDUCTOR DEVICE PACKAGE AND METHOD OF MANUFACTURING THE SAME

BACKGROUND

1. Field of the Disclosure

The instant disclosure relates to, amongst other things, a semiconductor device package and method of manufacturing the same, and a semiconductor device package having a seed layer covering a side surface of an electrical terminal and method of manufacturing the same.

2. Description of Related Art

A semiconductor device includes an electrical connection, such as solder ball, connected to an electrical terminal, such as a ball pad. A tiny gap may be formed between the electrical terminal and the passivation layer after the ball placement or during the reliability test. For example, due to thermal stress and the mismatched coefficient of thermal expansion (CTE) between conductive material and passivation material, the tiny gap is prone to be formed at the sidewall of the ball pad where having direct contact with the dielectric layer surrounding the ball pad, thereby, causing a delamination between the electrical terminal and the passivation layer.

SUMMARY

According to one example embodiment of the instant disclosure, a semiconductor device package includes a redistribution layer having an electrical terminal adjacent to a surface of the redistribution structure and a seed layer covering a side surface of the electrical terminal. Further, an electrical connection is connected to a first surface of the electrical terminal. In addition, the seed layer extends to the first surface of the electrical terminal.

According to another example embodiment of the instant disclosure, a semiconductor device package includes a redistribution structure having an electrical terminal adjacent to a surface of the redistribution layer. An electrical connection is connected to a first surface of the electrical terminal. The electrical connection has a side surface adjacent to and angled with respect to the first surface of the electrical terminal. Further, the first surface of the electrical terminal and a portion of the electrical connection are covered by the redistribution structure.

According to another example embodiment of the instant disclosure, method of manufacturing a semiconductor device package includes: providing a carrier with an upper surface; forming a first dielectric layer over the upper surface of the carrier, wherein a number of first openings are formed on the first dielectric layer; forming a seed layer on the first dielectric layer and side surfaces of the first openings; forming a masking layer on the seed layer, wherein a number of second openings are formed on the masking layer and wherein the second openings respectively correspond to and communicate with the first openings; forming pad portions in the first openings by a first plating operation; removing the masking layer; and forming trace portions on the seed layer and connecting to the pad portions by a second plating operation.

In order to further understanding of the instant disclosure, the following embodiments are provided along with illustrations to facilitate appreciation of the instant disclosure; however, the appended drawings are merely provided for reference and illustration, and do not limit the scope of the instant disclosure.

DETAILED DESCRIPTION

Figure 1:
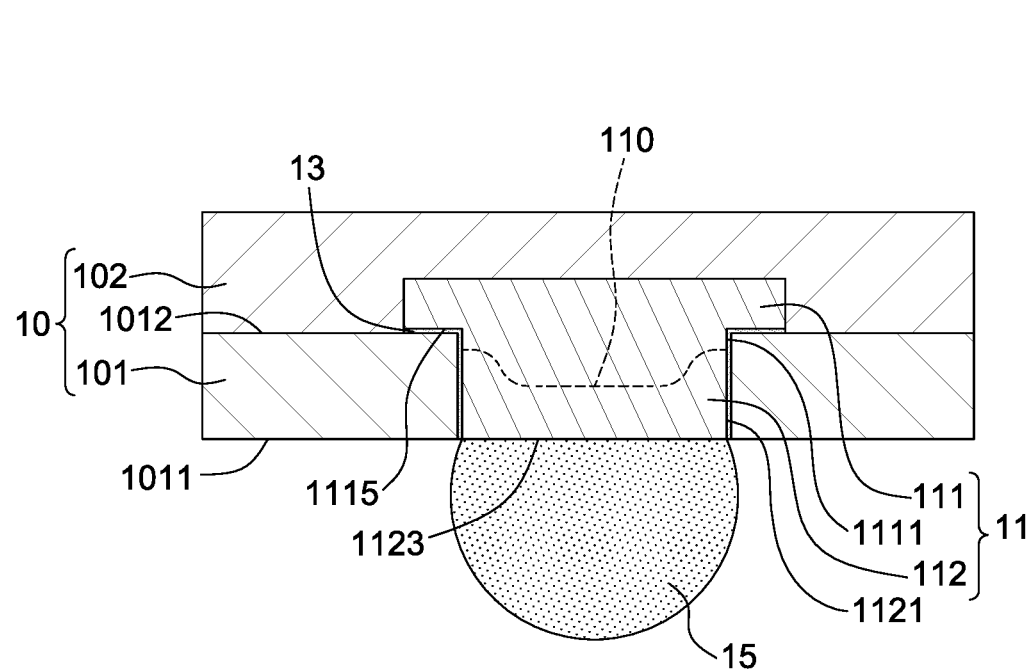
FIG. 1 is a cross-sectional view of a semiconductor device package in accordance with an embodiment of the instant disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

In some embodiments, present disclosure provides a semiconductor device package with a fan-out structure includes a redistribution structure with an electrical terminal and an electrical connection connected to the electrical terminal. In addition, the semiconductor device package further includes a seed layer covering a side surface of the electrical terminal. This configuration prevents the delamination being formed between the electrical terminal and the passivation layer, and thus the yield and reliability of the semiconductor device package can be improved.

FIG. 1 is a cross-sectional view of a semiconductor device package 1 in accordance with some embodiments of the present disclosure. As shown in FIG. 1, the semiconductor device 1 includes a redistribution structure (RDL) 10 with an electrical terminal 11 and an electrical connection 15 connected to the electrical terminal 11. The redistribution layer 10 includes a dielectric layer 101 (e.g., a lower dielectric layer) and a dielectric layer 102 (e.g., an upper dielectric layer). The dielectric layer 101 includes a surface 1011 (e.g., a lower surface) and a surface 1012 (e.g., an upper surface) opposite to the surface 1011. The dielectric layer 102 is stacked on the surface 1012 of the dielectric layer 101.

As shown in FIG. 1, the electrical terminal 11 is arranged to be adjacent to the surface 1011 of the redistribution structure 10. The electrical terminal 11 includes a pad portion 112 and a trace portion 111 connected to the pad portion 112. The pad portion 112 includes a surface 1123 adjacent to the surface 1011 of the dielectric layer 101. Further, the surface 1123 of the pad portion 112 may be exposed from the surface 1011 of the dielectric layer 101 and the electrical connection 15 is disposed on the surface 1123 of the pad portion 112. The electrical connection 15 may include a solder ball or a solder bump such as a C4 bump. The trace portion 111 may be a portion of a conductive wiring layer. The material of the conductive wiring(s) may include metal such as copper (Cu) or the like. The trace portion 111 may be substantially arranged above the pad portion 112. Further, the trace portion 111 includes a side surface 1111 and a surface 1115 adjacent to and angled with respect to the side surface 1111. The side surface 1111 of the trace portion 111 may be surrounded by the dielectric layer 101. The surface 1115 of the trace portion 111 may be disposed on the surface 1012 of the dielectric layer 101. In addition, the electrical terminal 11 further includes an interface 110 being located between the trace portion 111 and the pad portion 112. The interface 110 is concave toward the electrical connection 15.

Referring to FIG. 1, the semiconductor device package 1 further includes a seed layer 13. In some embodiments, the seed layer 13 is located between the electrical terminal 11 and the dielectric layer 101. The seed layer 13 may cover the surface 1115 and the side surface 1111 of the trace portion 111 and the side surface 1121 of the pad portion 112. Especially, the seed layer 13 may extend to the surface 1123 of the trace portion. Since the seed layer 13 covers the side surface 1111 of the trace portion 111 and the side surface 1121 of the pad portion 112 and/or extends to the surface 1123 of the pad portion 112, the delamination between the electrical terminal 11 and the electrical connection 15 could be prevented.

Figure 2A:
FIG. 2A, FIG. 2B, FIG. 2C, FIG. 2D, FIG. 2E, FIG. 2F, FIG. 2G, FIG. 2H, FIG. 2I and FIG. 2J illustrate a method of manufacturing a semiconductor device package in accordance with another embodiment of the instant disclosure.

FIG. 2A, FIG. 2B, FIG. 2C, FIG. 2D, FIG. 2E, FIG. 2F, FIG. 2G, FIG. 2H, FIG. 2I and FIG. 2J illustrate operations of manufacturing a semiconductor device package 1 in accordance with some embodiments of the present disclosure. As shown in FIG. 2A, a carrier 51 is provided. The carrier 51 may include a seed layer 52 disposed on a surface 511 of the carrier 51.

Figure 2B:
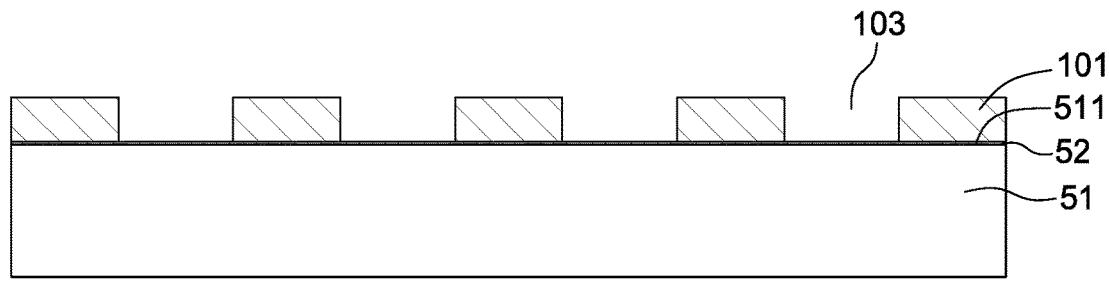

In FIG. 2B, a dielectric layer 101 is formed on the seed layer 52 by a coating or depositing operation. Further, a number of openings 103 are formed on the dielectric layer 101 and portions of the seed layer 52 could be exposed in the openings 103.

Figure 2C:
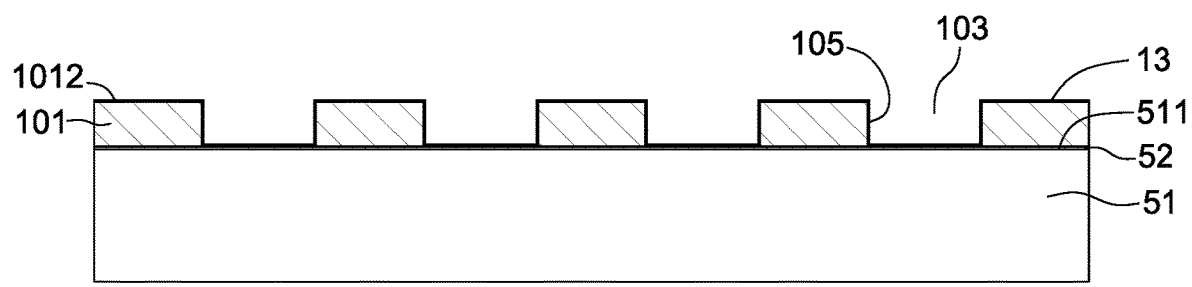

In FIG. 2C, a seed layer 13 is formed, for example, by a sputtering operation, on a surface 1012 of the dielectric layer 101, side surfaces 105 of the openings 103 and the portions of the seed layer 52

Figure 2D:
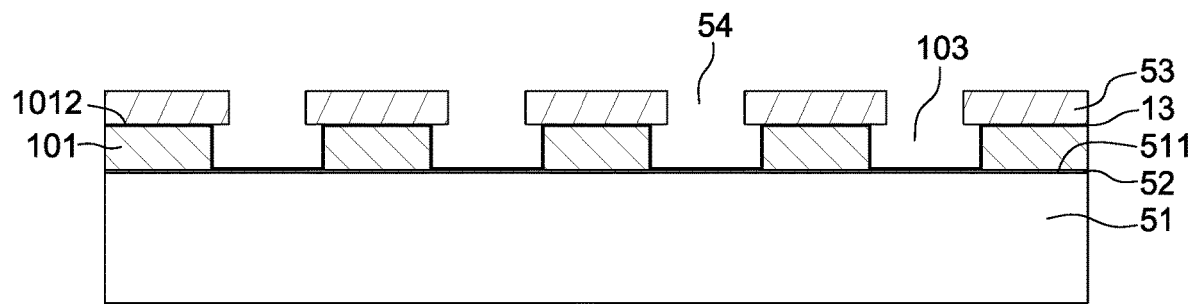

In FIG. 2D, a mask layer 53 is formed on the seed layer 13 and the remaining dielectric layer 101. The mask layer 53 may include a lamination layer. A number of openings 54 are formed on the mask layer 53. The openings 53 respectively correspond to the openings 103 and communicate with the openings 103. As shown in FIG. 2D, the opening 54 is arranged above the opening 103. In addition, a diameter of the opening 103 may be greater than a diameter of the opening 54.

Figure 2E:
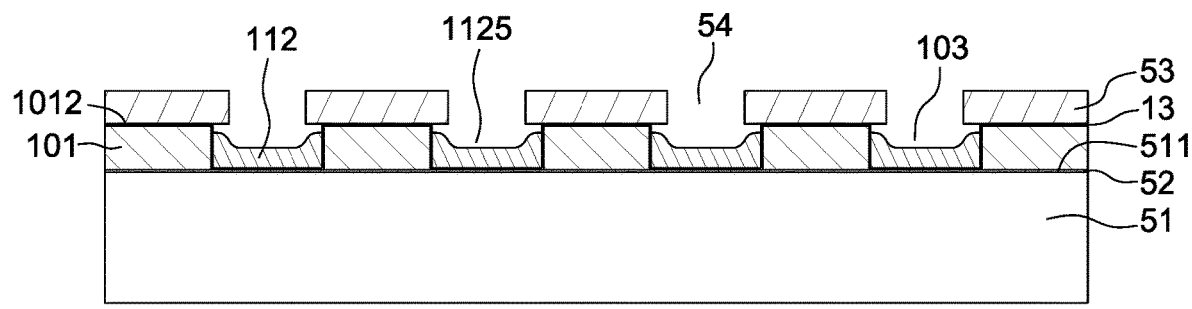

In FIG. 2E, pad portions 112 are formed in the openings 103 by a plating operation (e.g., an electroplating operation). A surface 1125 (e.g., an upper surface) may appear to be concave toward the carrier 51. Because the seed layer 13 lines at the side surfaces 105 and bottom surfaces of the openings 103, at the initial stage of the plating operation, plated materials may be simultaneously deposited at the side surfaces 105 and the bottom surfaces, and subsequently toward a center of the opening 103. As a result, the surface 1125 of the pad portions 112 appears to possess a concave profile.

Referring to FIG. 2D and FIG. 2E, the opening 54 of the mask layer 53 may possess an aperture smaller than that of the opening 103 of the dielectric layer 101. In some embodiments, this aperture size discrepancy is arranged to prevent the plated materials from overfilling the opening 103 and laterally encroach toward the surface 1012 of the dielectric layer 101.

Figure 2F:
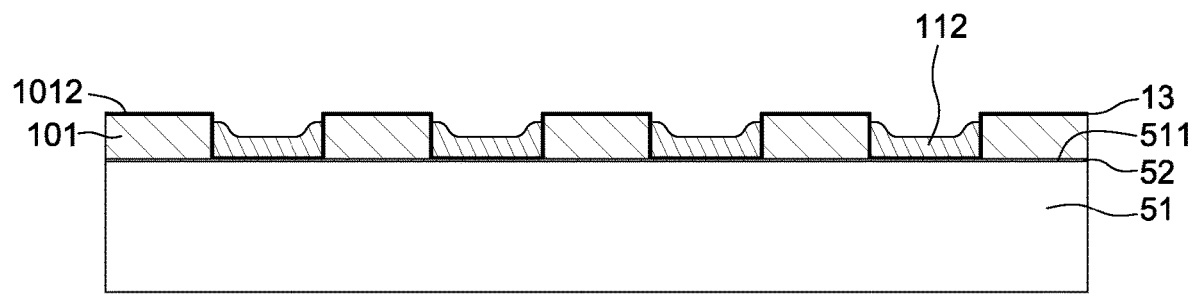

In FIG. 2F, the mask layer 53 is removed by a stripping operation. In some embodiments, the mask layer 53 may be composed of photoresist, dry film material, or other polymeric materials which can be removed after the plating operation.

Figure 2G:
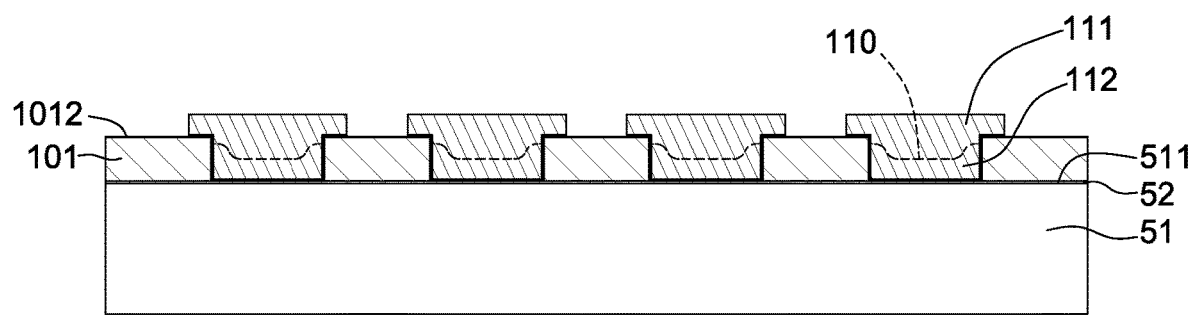

In FIG. 2G, trace portions 111 are formed on the seed layer 13 and the pad portions 112 by another plating operation (e.g., an electroplating operation). Although not illustrated in FIG. 2G, another masking layer for the plating of the trace portion 111 may be disposed over the remaining portion of the dielectric layer 101 with an even wider aperture than that of the opening 103. The trace portion 111 is electrically connected to the pad portion 112. In addition, since the surface 1125 of the pad portion 112 is concave, a concave interface 110 is formed between the trace portion 111 and the pad portion 112. Subsequently, the masking layer for the plating of the trace portion 111 can be removed by an operation similar to that of removing the mask layer 53.

Figure 2H:
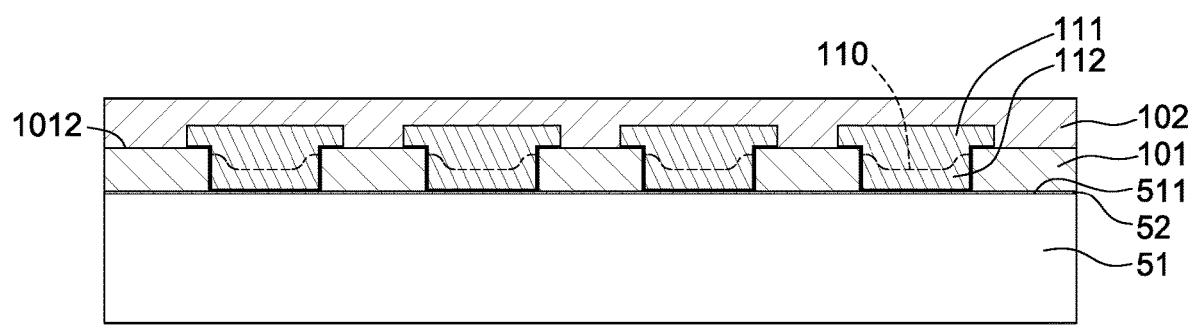

In FIG. 2H, a dielectric layer 102 is formed on the dielectric layer 101 by another deposition operation and covering the trace portions 111 of the electrical terminal 11.

Figure 2I:
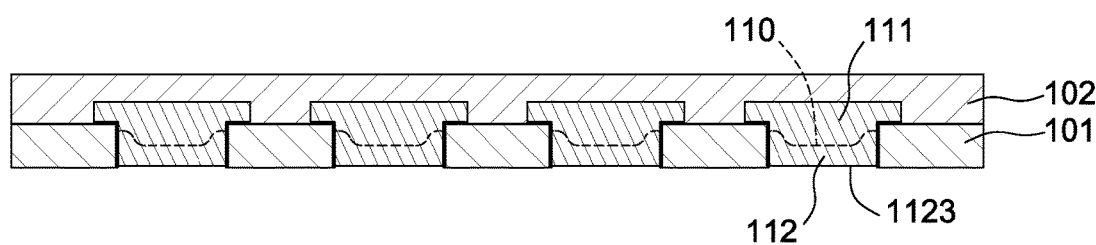

In FIG. 2I, the carrier 51 and the seed layer 52 are detached from the pad portion 112 and the dielectric layer 101. Further, portions of the seed layer 13 on surfaces 1123 of the pad portions 112 are removed by an etching operation. The surfaces 1123 of the pad portions 112 are exposed.

Figure 2J:
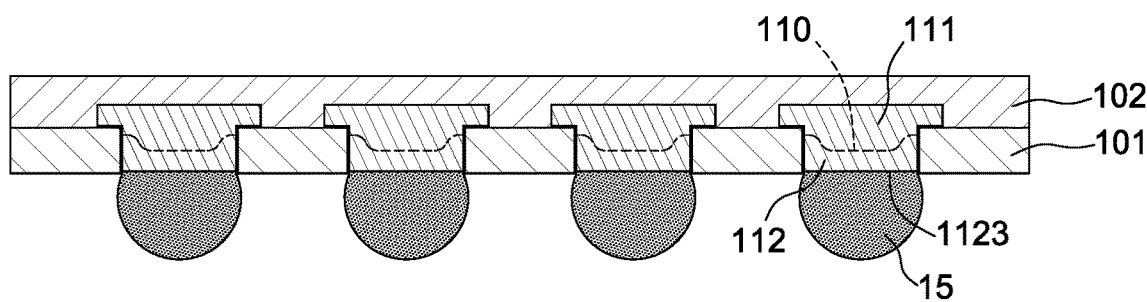

In FIG. 2J, electrical connections 15 are respectively formed on the surfaces 1123 the pad portions 112. The electrical connection 15 is electrically connected to the pad portion 112.

Figure 3:
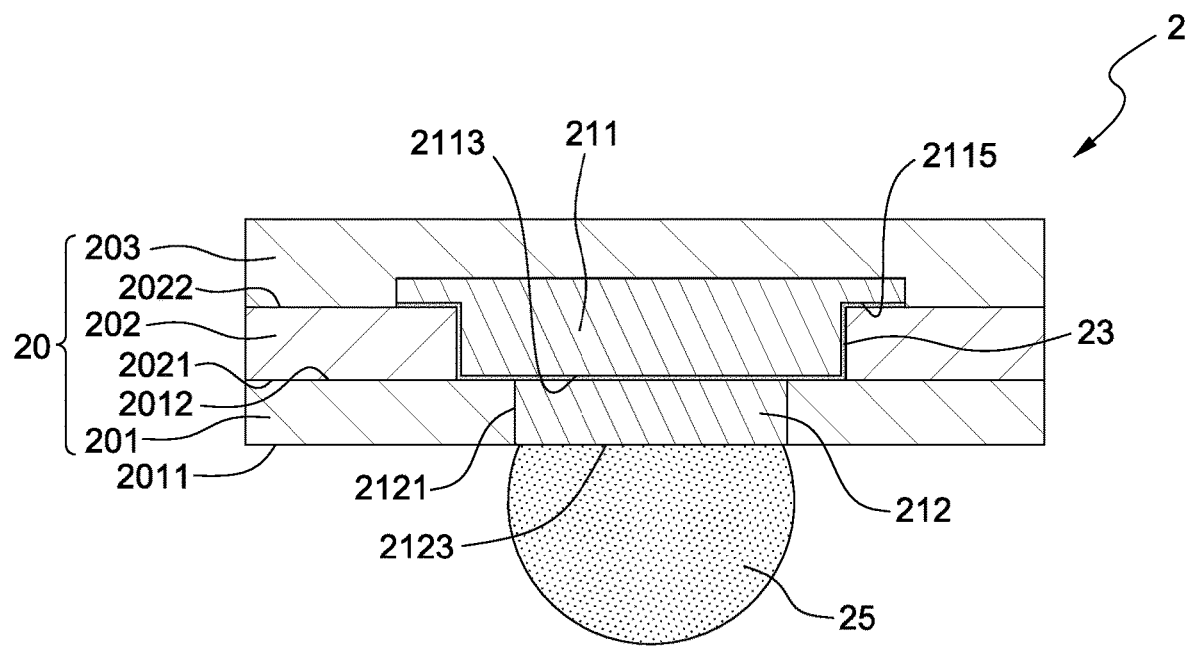
FIG. 3 is a cross-sectional view of a semiconductor device package in accordance with an embodiment of the instant disclosure.

FIG. 3 is a cross-sectional view of a semiconductor device package 2 in accordance with some embodiments of the present disclosure. As shown in FIG. 3, the semiconductor device 2 includes a redistribution structure (RDL) 20 with an electrical terminal 211, a pad 212 connected to the electrical terminal and an electrical connection 25 connected to the pad 212. The redistribution layer 20 includes a dielectric layer 201 (e.g., a lower dielectric layer), a dielectric layer 202 (e.g., a middle dielectric layer) and a dielectric layer 203 (e.g., an upper dielectric layer). The dielectric layer 201 includes a surface 2011 (e.g., a lower surface) and a surface 2012 (e.g., an upper surface) opposite to the surface 2011. The dielectric layer 202 is stacked on the surface 2012 of the dielectric layer 201. The dielectric layer 202 includes a surface 2021 (e.g., a lower surface) and a surface 2022 (e.g., an upper surface) opposite to the surface 2021. The dielectric layer 203 is stacked on the surface 2022 of the dielectric layer 202.

As shown in FIG. 3, the electrical terminal 211 and the pad 212 are arranged to be adjacent to the surface 2011 of the redistribution structure 20. The electrical terminal 211 is substantially surrounded by the dielectric layers 202 and 203, and the pad 212 is substantially surrounded by the dielectric layer 201. The pad 212 includes a surface 2123 adjacent to the surface 2011 of the dielectric layer 201. Further, the surface 2123 of the pad 212 may be exposed from the surface 2011 of the dielectric layer 201 and the electrical connection 25 is disposed on the surface 2123 of the pad 212. The electrical connection 25 may include a solder ball or a solder bump such as a C4 bump. The electrical terminal 211 may be a portion of a conductive wiring layer. The material of the conductive wiring(s) may include metal such as copper (Cu) or the like. In some embodiments, the electrical connection 25 may include an intermetallic compound (IMC), and the intermetallic compound may be formed on a surface 2113 (e.g., a lower surface) of the electrical terminal 211. The electrical terminal 211 may be substantially arranged above the pad 212. That is, the pad 212 is disposed on the surface 2113 of the electrical terminal 211. The electrical terminal 211 includes a side surface 2111 substantially covered by the dielectric layer 202. Further, the electrical terminal 211 includes a surface 2115 adjacent to and angled with respect to the side surface 2111. The surface 2115 of the electrical terminal 211 may be disposed on the surface 2022 of the dielectric layer 202. Moreover, referring to FIG. 3, the pad 212 includes a side surface 2121 disposed on and angled with respect to the surface 2113 of the electrical terminal 211. A portion of the surface 2113 of the electrical terminal 211 may be disposed on the surface 2012 of the dielectric layer 201. That is, the dielectric layer 201 covers a portion of the surface 2113 of the electrical terminal 211. Since the surface 2113 of the electrical terminal 211 is angled with respect to the side surface 2121 of the pad 212 and a portion of the surface 2113 is covered by the dielectric layer 201, the delamination between the electrical terminal 211 and the pad 212 (with the electrical connection 25) could be prevented.

Referring to FIG. 3, the semiconductor device package 2 further includes a seed layer 23. The seed layer 23 may cover the surface 2115, the side surface 2111 and the surface 2113 of the electrical terminal 211. In other words, the seed layer 23 extends on the surface 2115, the side surface 2111 and the surface 2113 of the electrical terminal 211.

Figure 4A:
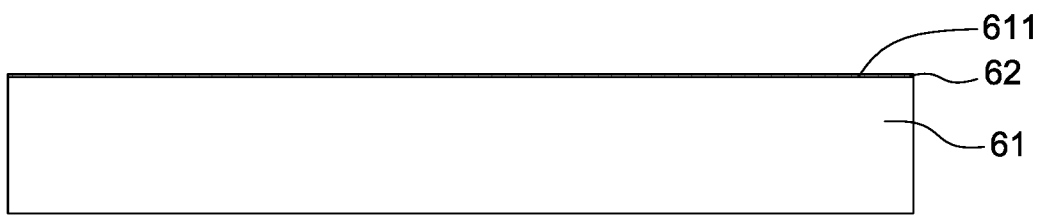
FIG. 4A, FIG. 4B, FIG. 4C, FIG. 4D, FIG. 4E, FIG. 4F, FIG. 4G, FIG. 4H and FIG. 4I illustrate a method of manufacturing a semiconductor device package in accordance with another embodiment of the instant disclosure.

FIG. 4A, FIG. 4B, FIG. 4C, FIG. 4D, FIG. 4E, FIG. 4F, FIG. 4G, FIG. 4H and FIG. 4I illustrate operations of manufacturing a semiconductor device package 2 in accordance with some embodiments of the present disclosure. As shown in FIG. 4A, a carrier 61 is provided. The carrier 61 may include a seed layer 62 disposed on a surface 611 of the carrier 61.

Figure 4B:
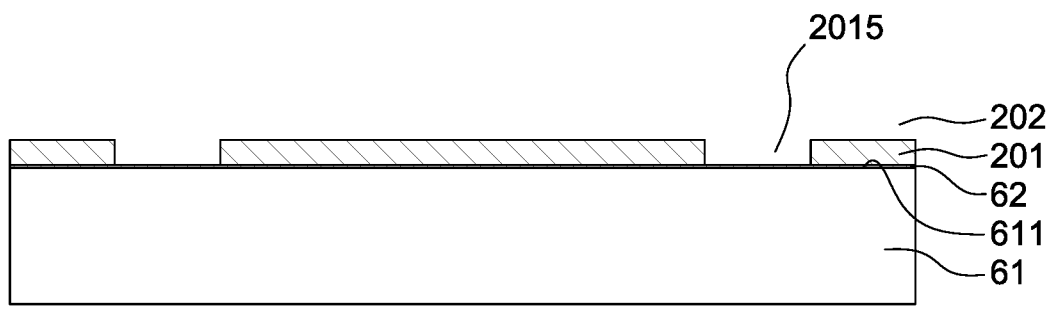

In FIG. 4B, a dielectric layer 201 is formed on the seed layer 62 by a coating or depositing operation. Further, a number of openings 2015 are formed on the dielectric layer 201 and portions of the seed layer 62 could be exposed in the openings 2015.

Figure 4C:
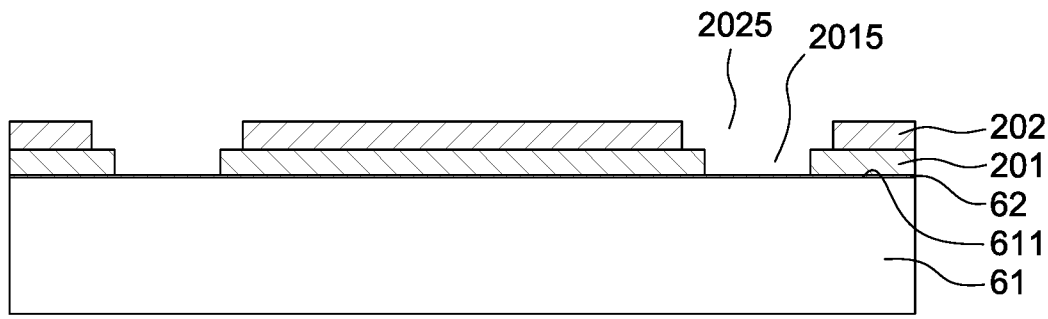

In FIG. 4C, a dielectric layer 202 is formed on the dielectric layer 201. Further, a number of openings 2025 are formed on the dielectric layer 202. The openings 2025 respectively correspond to the openings 2015 and communicate with the openings 2015. As shown in FIG. 4C, the opening 2025 is arranged above the opening 2015. In addition, a cross-sectional width of the opening 2025 is greater than a cross-sectional width of the opening 2015.

Figure 4D:
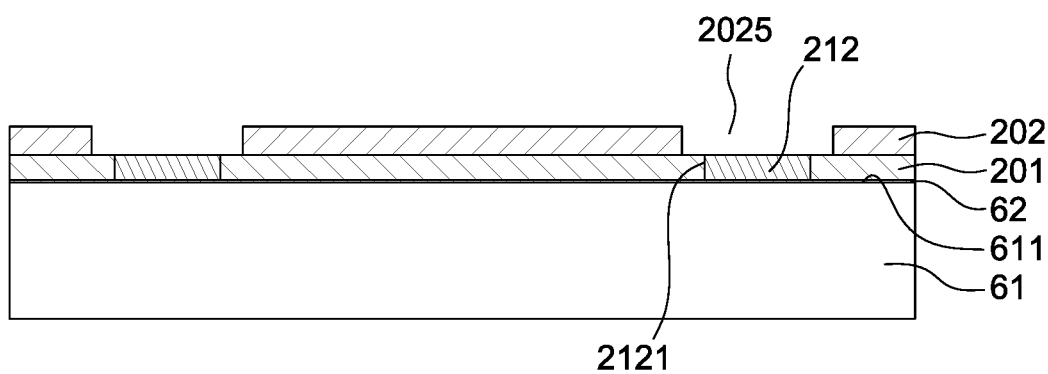

In FIG. 4D, pads 212 are formed in the openings 2015 by a plating operation.

Figure 4E:
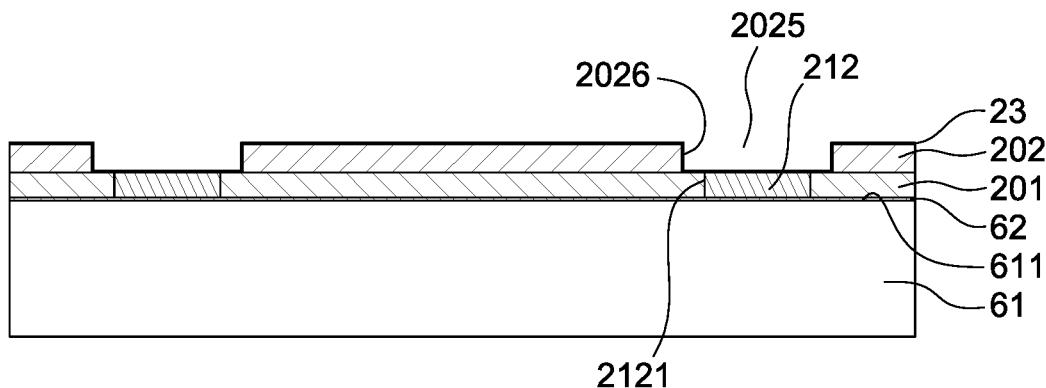

In FIG. 4E, a seed layer 23 is formed on a surface 2022 of the dielectric layer 202, side surfaces 2026 of the openings 2025 and the pad 212 by a sputtering operation.

Figure 4F:
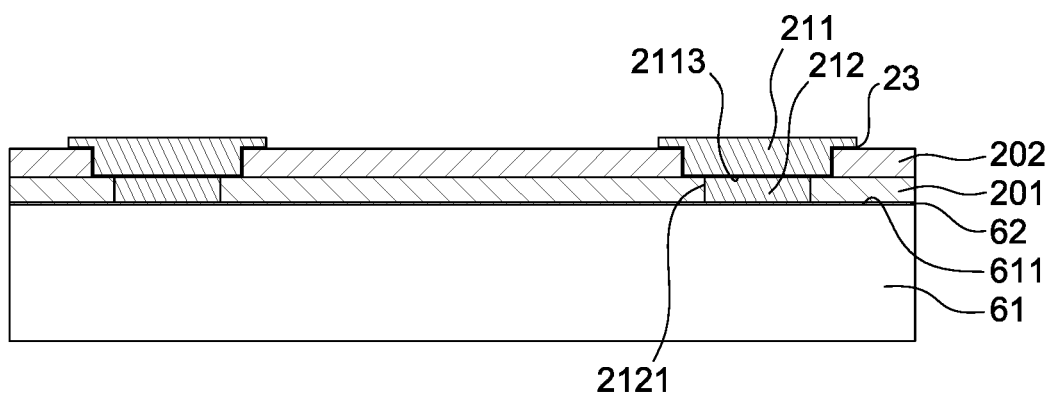

In FIG. 4F, electrical terminals 211 are formed on the seed layer 23 and the pads 212 by another plating operation. Although not illustrated in FIG. 4E and FIG. 4F, a masking layer for the subsequent electrical terminals 211 plating can be formed over the dielectric layer 202 and having an aperture wider than that of the openings 2025. The electrical terminal 211 is electrically connected to the pad 212. Further, since the cross-sectional width of the opening 2025 is greater than the cross-sectional width of the opening 2015, a side surface 2121 of the pad 212 is disposed on and angled with respect to a surface 2113 of the electrical terminal 211.

Figure 4G:
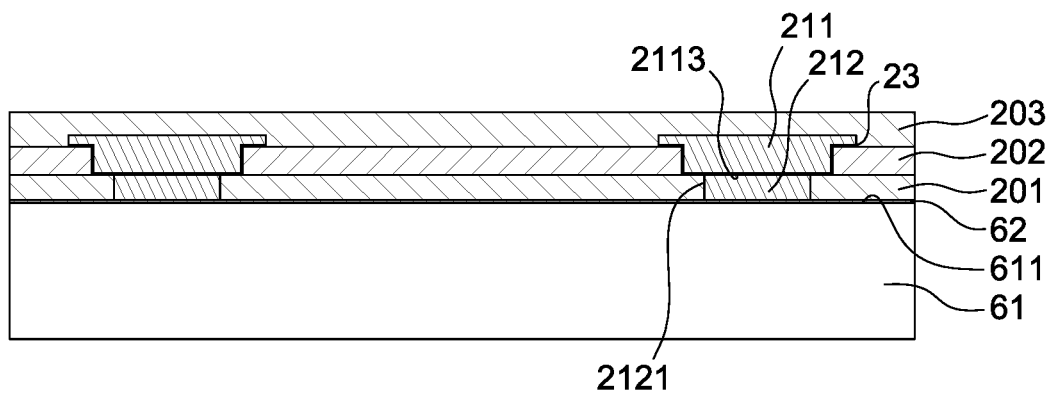

In FIG. 4G, a dielectric layer 203 is formed on the dielectric layer 202 by another coating or depositing operation.

Figure 4H:
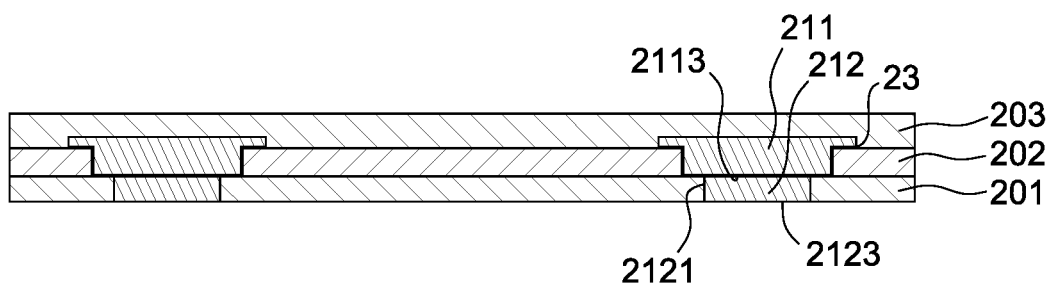

In FIG. 4H, the carrier 61 and the seed layer 62 are removed, and thus surfaces 2123 of the pads 212 are exposed.

Figure 4I:
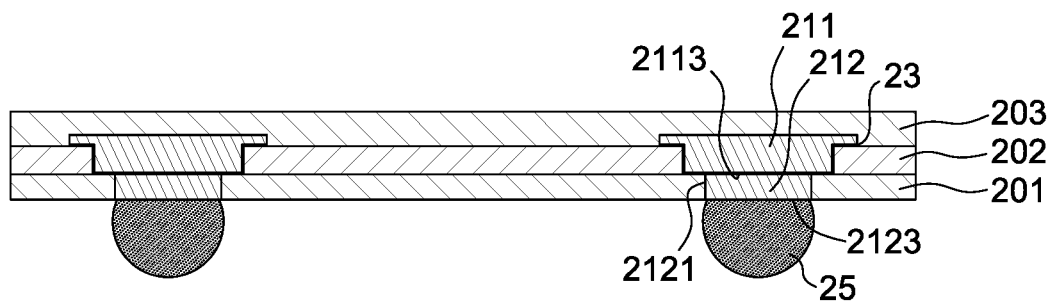

In FIG. 4I, electrical connections 25 are respectively formed on the surfaces 2123 the pads 212. The electrical connection 25 is electrically connected to the pad 212. Meanwhile, the electrical connection 25 may react with the pad 212, which in some embodiment possesses a thickness of about 3 μm, and rendering the pad 212 being partially or completely composed of intermetallic compound (IMC). Thus, in some embodiments, an intermetallic compound (IMC) section may be observed between the electrical connection 25 and the electrical terminal 211.

Figure 5:
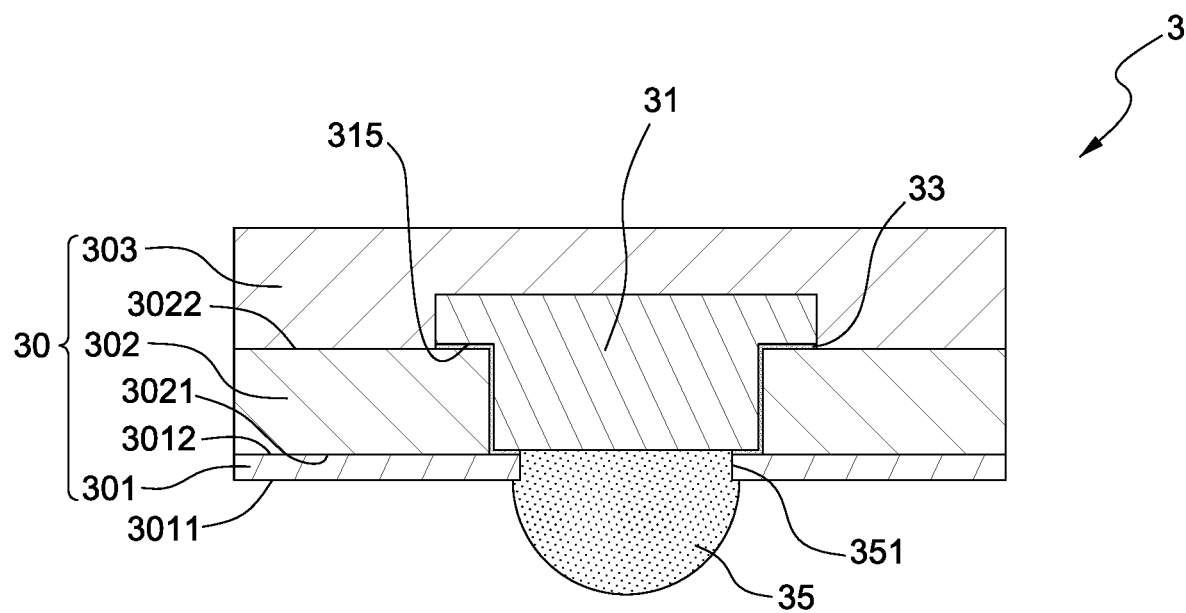
FIG. 5 is a cross-sectional view of a semiconductor device package in accordance with an embodiment of the instant disclosure.

FIG. 5 is a cross-sectional view of a semiconductor device package 3 in accordance with some embodiments of the present disclosure. As shown in FIG. 5, the semiconductor device 3 includes a redistribution structure (RDL) 30 with an electrical terminal 31 and an electrical connection 35 connected to the electrical terminal 31. The redistribution layer 30 includes a dielectric layer 301 (e.g., a lower dielectric layer), a dielectric layer 302 (e.g., a middle dielectric layer) and a dielectric layer 303 (e.g., an upper dielectric layer). The dielectric layer 301 includes a surface 3011 (e.g., a lower surface) and a surface 3012 (e.g., an upper surface) opposite to the surface 3011. The dielectric layer 302 is stacked on the surface 3012 of the dielectric layer 301. The dielectric layer 302 includes a surface 3021 (e.g., a lower surface) and a surface 3022 (e.g., an upper surface) opposite to the surface 3021. The dielectric layer 303 is stacked on the surface 3022 of the dielectric layer 302.

As shown in FIG. 5, the electrical terminal 31 is arranged to be adjacent to the surface 3011 of the redistribution structure 30. The electrical terminal 31 is substantially surrounded by the dielectric layers 302 and 303. The electrical terminal 31 includes a surface 313 adjacent to the surface 3021 of the dielectric layer 302. Further, the surface 313 of the electrical terminal 31 may be exposed from the surface 3021 of the dielectric layer 302 and the electrical connection 35 is disposed on the surface 313 of the electrical terminal 31. The electrical connection 35 may include a solder ball or a solder bump such as a C4 bump. The electrical terminal 31 may be a portion of a conductive wiring layer. The material of the conductive wiring(s) may include metal such as copper (Cu) or the like. The electrical terminal 31 includes a side surface 311 substantially covered by the dielectric layer 302. Further, the electrical terminal 31 includes a surface 315 adjacent to and angled with respect to the side surface 311. The surface 315 of the electrical terminal 31 may be disposed on the surface 3022 of the dielectric layer 302. Moreover, referring to FIG. 5, the electrical connection 35 includes a side surface 351 disposed on and angled with respect to the surface 313 of the electrical terminal 31. A portion of the surface 313 of the electrical terminal 31 may be disposed on the surface 3012 of the dielectric layer 301. That is, the dielectric layer 301 covers a portion of the side surface 351 of the electrical connection 35. Since the surface 313 of the electrical terminal 31 is angled with respect to the side surface 351 of the electrical connection 35 and a portion of the surface 313 is covered by the dielectric layer 301, the delamination between the electrical terminal 31 and the electrical connection 35 could be prevented.

Referring to FIG. 5, the semiconductor device package 3 further includes a seed layer 33. The seed layer 33 may cover the surface 315, the side surface 311 and the surface 313 of the electrical terminal 31. In other words, the seed layer 33 extends on the surface 315, the side surface 311 and the surface 313 of the electrical terminal 31.

Figure 6A:
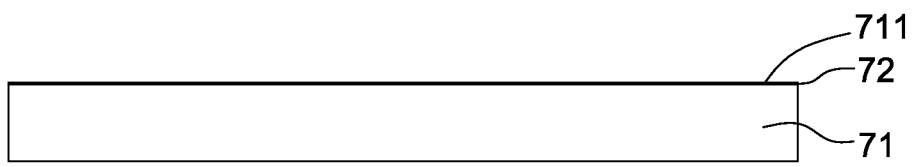
FIG. 6A, FIG. 6B, FIG. 6C, FIG. 6D, FIG. 6E, FIG. 6F, FIG. 6G, FIG. 6H and FIG. 6I illustrate a method of manufacturing a semiconductor device package in accordance with another embodiment of the instant disclosure.

FIG. 6A, FIG. 6B, FIG. 6C, FIG. 6D, FIG. 6E, FIG. 6F, FIG. 6G, FIG. 6H and FIG. 6I illustrate operations of manufacturing a semiconductor device package 3 in accordance with some embodiments of the present disclosure. As shown in FIG. 6A, a carrier 71 is provided. The carrier 71 may include a seed layer 72 disposed on a surface 711 of the carrier 71.

Figure 6B:
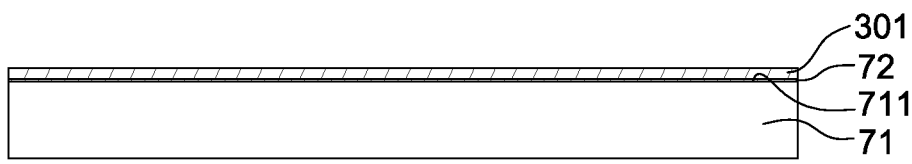

In FIG. 6B, a dielectric layer 301 is formed on the seed layer 72 by a coating or depositing operation.

Figure 6C:
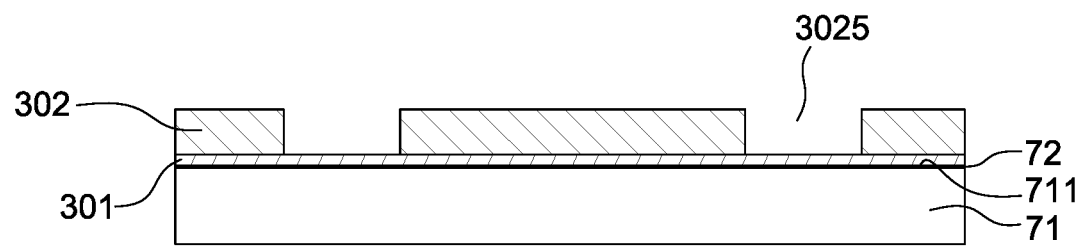

In FIG. 6C, a dielectric layer 302 is formed on the dielectric layer 301 by a coating or depositing operation. Further, a number of openings 3025 are formed on the dielectric layer 302 and portions of the dielectric layer 301 could be exposed in the openings 3025.

Figure 6D:
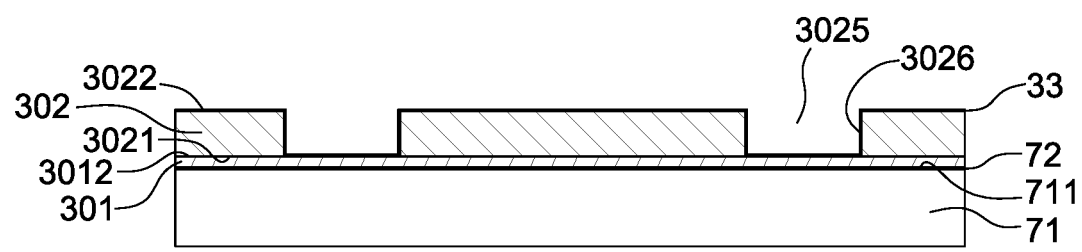

In FIG. 6D, a seed layer 33 is formed on a surface 3022 of the dielectric layer 302, side surfaces 3026 of the openings 3025 and portions of a surface 3012 of the dielectric layer 301 by a sputtering operation.

Figure 6E:
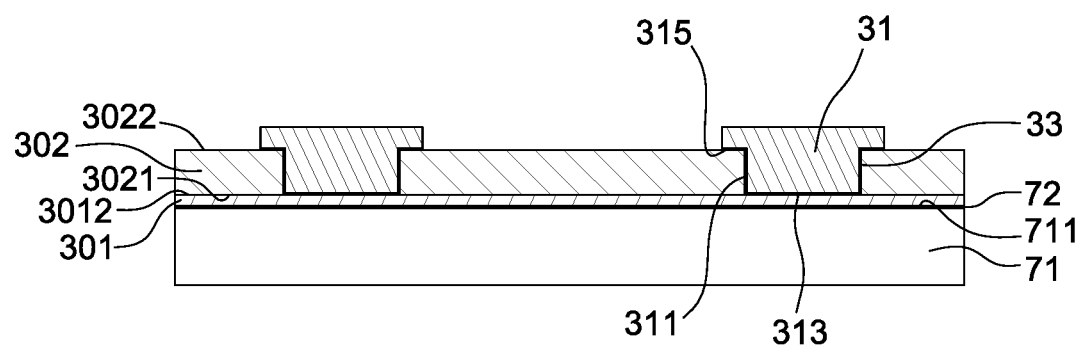

In FIG. 6E, electrical terminals 31 are formed on the seed layer 33 by a plating operation. The electrical terminal 31 includes a surface 315 disposed on the surface 3022 of the dielectric layer 302, a side surface 311 disposed on the side surface 3026 of the opening 3025 and a surface 313 disposed on a surface 3012 of the dielectric layer 301. That is, the seed layer 33 covers the side surface 311 and the surfaces 313 and 315 of the electrical terminal 31. A portion of the seed layer 33 which is disposed on the surface 3022 of the dielectric layer 302 but is not covered by the surface 315 of the electrical terminal 31 is removed. Although not illustrated in FIG. 6E, a masking layer for the subsequent electrical terminals 31 plating can be formed over the dielectric layer 302 and having an aperture wider than that of the openings 3025.

Figure 6F:
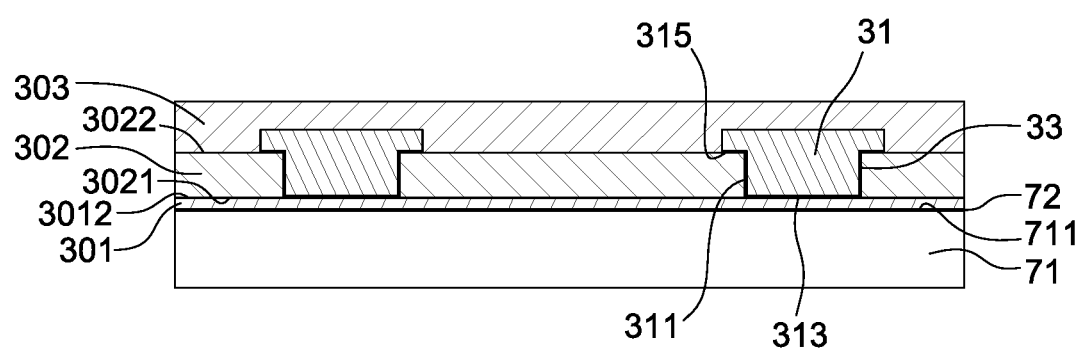

In FIG. 6F, a dielectric layer 303 is formed on the dielectric layer 302 by another coating or depositing operation.

Figure 6G:
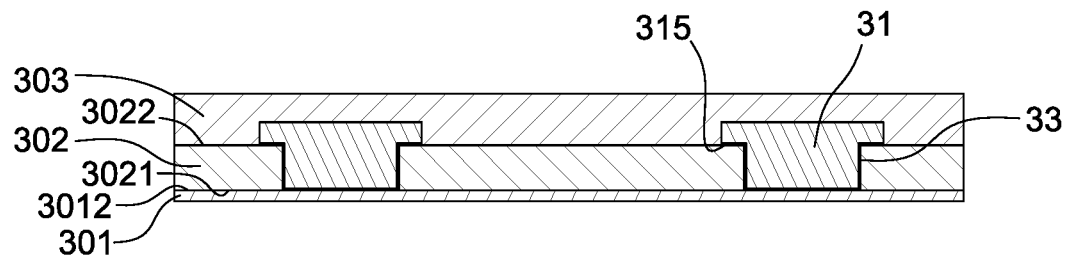

In FIG. 6G, the carrier 71 and the seed layer 72 are detached from the dielectric layer 301.

Figure 6H:
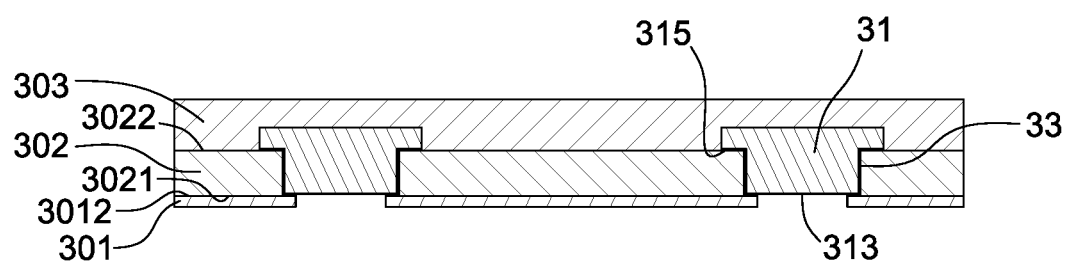

In FIG. 6H, a portion of the dielectric layer 301 and a portion of the seed layer 33 are removed by a laser operation such that a portion of the surface 313 of the electrical terminal 31 is exposed. In some embodiments, when an infrared (IR) laser drilling operation is performed, the dielectric layer 301 and the seed layer 33 may be selectively removed. In some embodiments, when an ultraviolet (UV) laser drilling operation is performed, in addition to the dielectric layer 301 and the seed layer 33, a small portion of the electrical terminal 31 can be removed and thereby creating a dimple or recess at the surface 313.

Figure 6I:
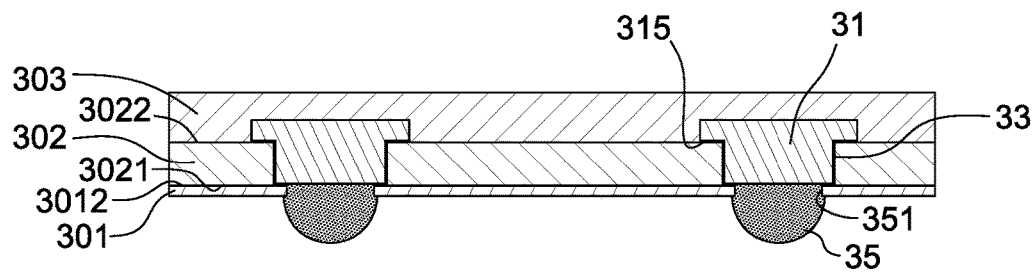

In FIG. 6I, electrical connections 35 are respectively formed on the surfaces 313 the electrical terminal 31. The electrical connection 35 is electrically connected to the electrical terminal 31. The electrical connection 35 includes a side surface 351 disposed on and angled with respect to the surface 313 of the electrical terminal 31. Further, the side surface 351 of the electrical connection 35 is covered by the dielectric layer 301.

Figure 7:
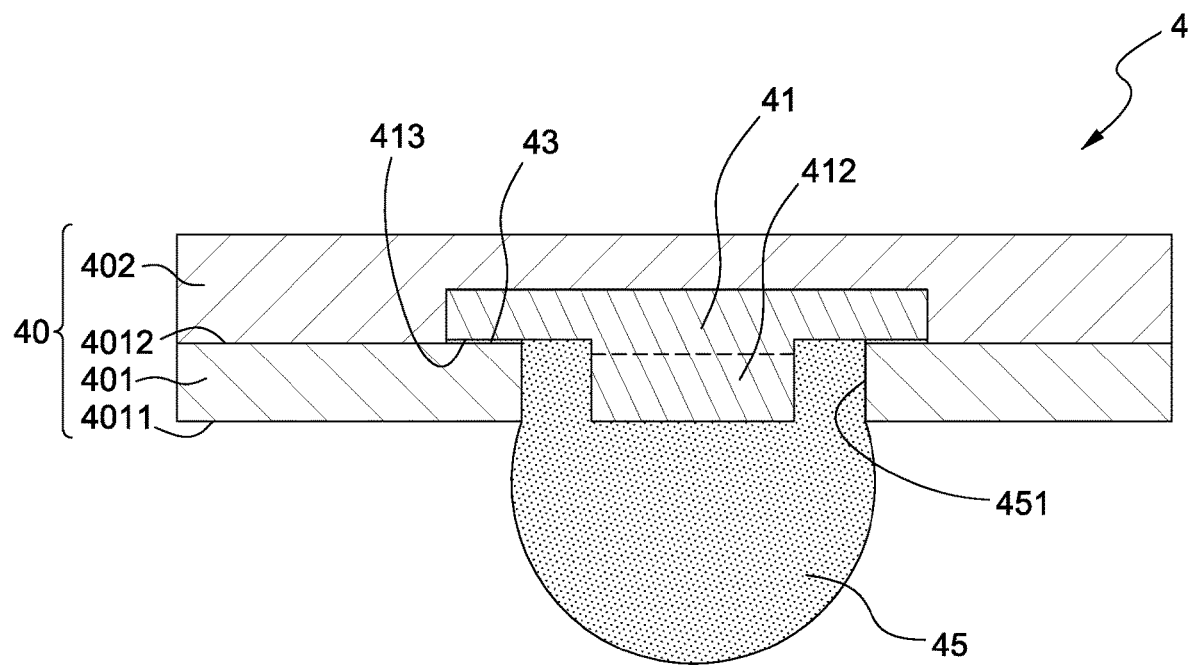
FIG. 7 is a cross-sectional view of a semiconductor device package in accordance with an embodiment of the instant disclosure.

FIG. 7 is a cross-sectional view of a semiconductor device package 4 in accordance with some embodiments of the present disclosure. As shown in FIG. 7, the semiconductor device 4 includes a redistribution structure (RDL) 40 with an electrical terminal 41, a pad 412 connected to the electrical terminal 41 and an electrical connection 45 connected to the electrical terminal 41 and covering the pad 412. The redistribution layer 40 includes a dielectric layer 401 (e.g., a lower dielectric layer) and a dielectric layer 402 (e.g., an upper dielectric layer). The dielectric layer 401 includes a surface 4011 (e.g., a lower surface) and a surface 4012 (e.g., an upper surface) opposite to the surface 4011. The dielectric layer 402 is stacked on the surface 4012 of the dielectric layer 401.

As shown in FIG. 7, the electrical terminal 41 and the pad 412 are arranged to be adjacent to the surface 4011 of the redistribution structure 40. The electrical terminal 41 is substantially surrounded by the dielectric layer 402. The electrical terminal 31 includes a surface 413 adjacent to a surface 4021 (e.g., a lower surface) of the dielectric layer 402. Further, a portion of the surface 413 of the electrical terminal 41 may be exposed from the surface 4021 of the dielectric layer 402 and the electrical connection 45 is disposed on the surface 413 of the electrical terminal 41. The electrical connection 35 may include a solder ball or a solder bump such as a C4 bump. The electrical terminal 31 may be a portion of a conductive wiring layer. The material of the conductive wiring(s) may include metal such as copper (Cu) or the like. The electrical terminal 31 includes a side surface 311 substantially covered by the dielectric layer 302. Moreover, referring to FIG. 5, the electrical connection 45 includes a side surface 451 disposed on and angled with respect to the surface 413 of the electrical terminal 41. Another portion of the surface 413 of the electrical terminal 41 may be disposed on the surface 4012 of the dielectric layer 401. That is, the dielectric layer 401 covers a portion of the side surface 451 of the electrical connection 45. Since the surface 413 of the electrical terminal 41 is angled with respect to the side surface 451 of the electrical connection 45 and a portion of the surface 413 is covered by the dielectric layer 401, the delamination between the electrical terminal 41 and the electrical connection 45 could be prevented. In addition, a pad 412 is disposed on the surface 413 of the electrical terminal 41 and thus electrically connected to the electrical terminal 41. Moreover, the pad 412 is covered by the electrical connection 45.

Referring to FIG. 7, the semiconductor device package 4 further includes a seed layer 43. The seed layer 43 may cover the surface 413 of the electrical terminal 41. In other words, the seed layer 43 extends on the surface 413 of the electrical terminal 41.

Figure 8A:
FIG. 8A, FIG. 8B, FIG. 8C, FIG. 8D, FIG. 8E, FIG. 8F, FIG. 8G, FIG. 8H, and FIG. 8I illustrate a method of manufacturing a semiconductor device package in accordance with another embodiment of the instant disclosure.

FIG. 8A, FIG. 8B, FIG. 8C, FIG. 8D, FIG. 8E, FIG. 8F, FIG. 8G, FIG. 8H and FIG. 8I illustrate operations of manufacturing a semiconductor device package 4 in accordance with some embodiments of the present disclosure. As shown in FIG. 8A, a carrier 81 is provided. The carrier 81 may include a seed layer 82 disposed on a surface 811 of the carrier 81.

Figure 8B:
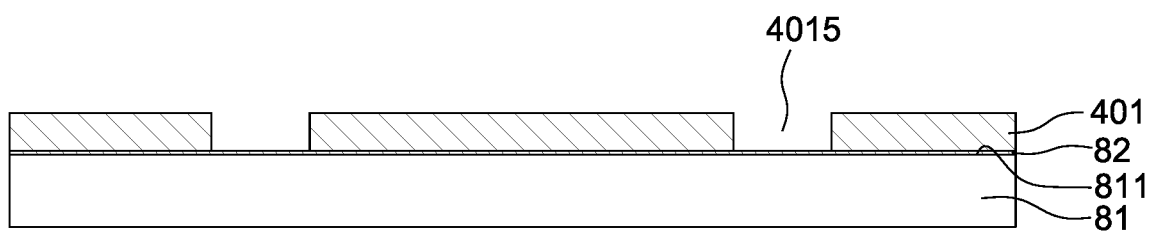

In FIG. 8B, a dielectric layer 401 is formed on the seed layer 82 by a coating or depositing operation. Further, a number of openings 4015 are formed on the dielectric layer 401 and portions of the seed layer 82 could be exposed in the openings 4015.

Figure 8C:
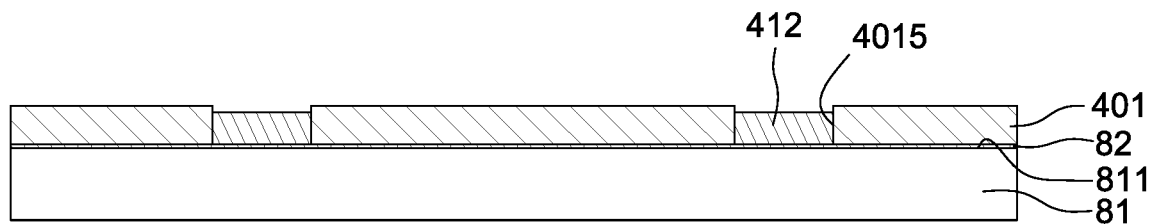

In FIG. 8C, pads 412 are formed in the openings 4015 by a plating operation.

Figure 8D:
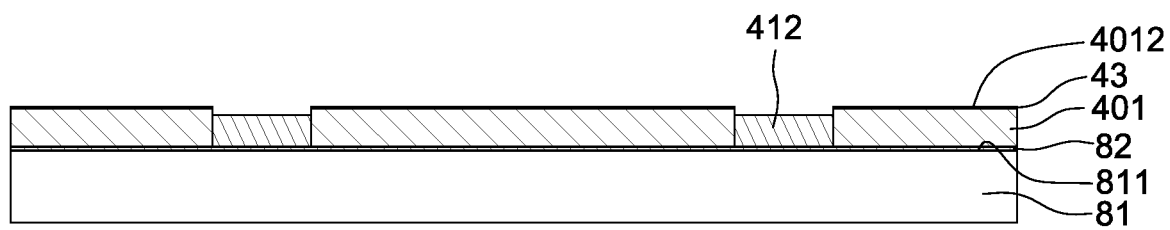

In FIG. 8D, a seed layer 43 is formed on a surface 4012 of the dielectric layer 401 and the pads 412 by a sputtering operation.

Figure 8E:
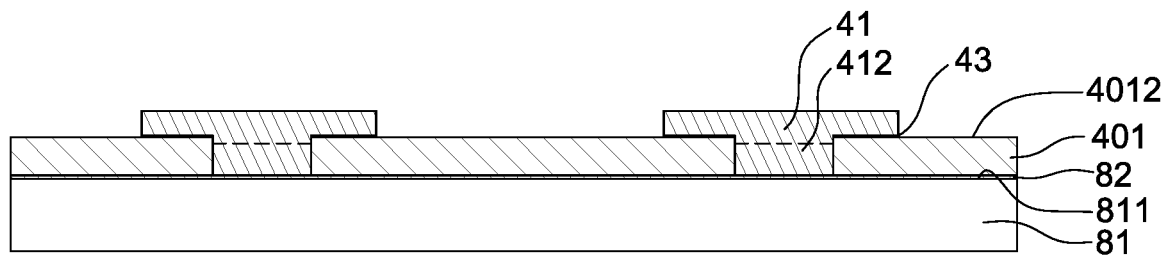

In FIG. 8E, electrical terminals 41 are formed on the pad 412 by a plating operation. The electrical terminal 41 includes a surface 413 disposed on the surface 4012 of the dielectric layer 401. That is, the seed layer 43 covers the surface 413 of the electrical terminal 41. A portion of the seed layer 43 which is disposed on the surface 4012 of the dielectric layer 401 but does not cover the surface 413 of the electrical terminal 41 is removed. Although not illustrated in FIG. 8E, a masking layer for the subsequent electrical terminals 41 plating can be formed over the dielectric layer 401 and having an aperture wider than that of the openings 4015.

Figure 8F:
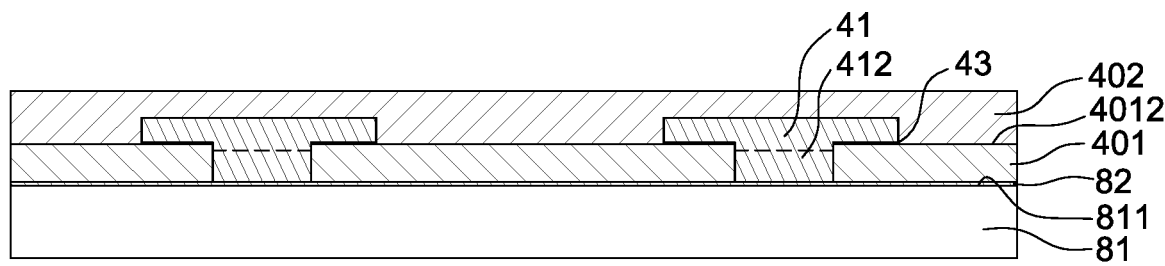

In FIG. 8F, a dielectric layer 402 is formed on the dielectric layer 401 by another coating or depositing operation.

Figure 8G:
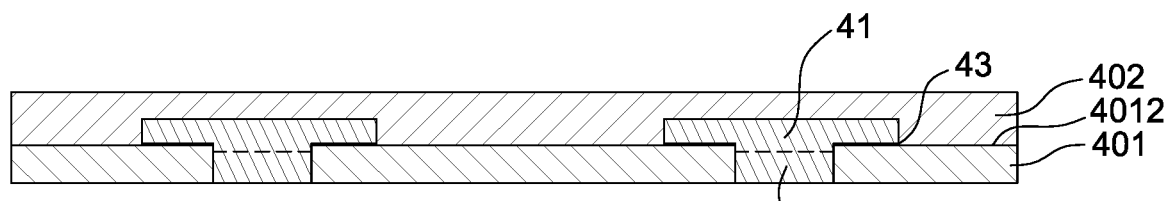

In FIG. 8G, the carrier 81 and the seed layer 82 are detached from the dielectric layer 401 and the pads 412.

Figure 8H:
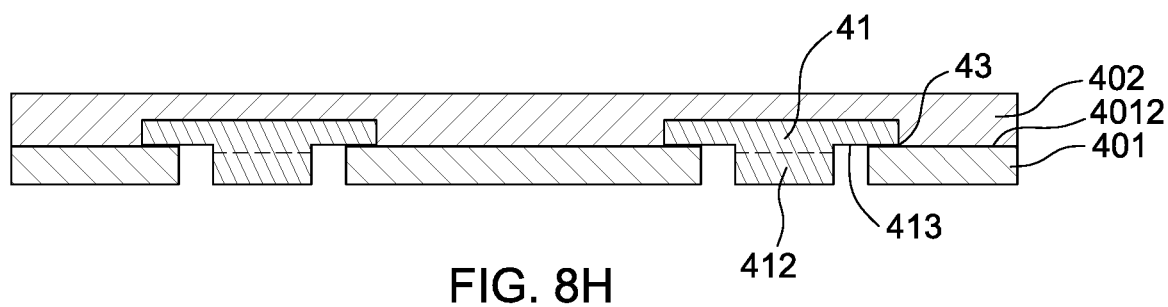

In FIG. 8H, a portion of the dielectric layer 401 and a portion of the seed layer 43 are removed by a laser operation such that the pad 412 and a portion of the surface 413 of the electrical terminal 41 are exposed. In some embodiments, an infrared (IR) laser drilling operation is performed, removing the portion of the dielectric layer 401 adjacent to the pad 412 by an appropriate spot size of the IR laser.

Figure 8I:
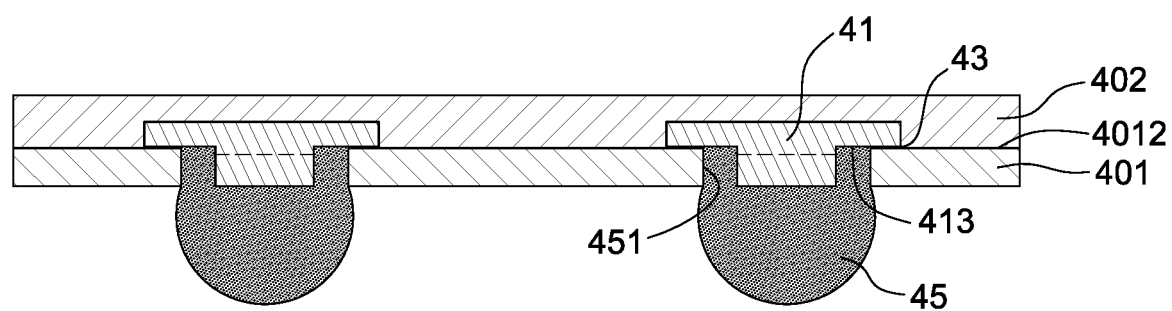

In FIG. 8I, electrical connections 45 are respectively formed on the surfaces 413 the electrical terminal 41. The electrical connection 45 is electrically connected to the electrical terminal 41 and covers the pad 412. The electrical connection 45 includes a side surface 451 disposed on and angled with respect to the surface 413 of the electrical terminal 41. Further, the side surface 451 of the electrical connection 45 is covered by the dielectric layer 401.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A semiconductor device package, comprising:
a redistribution structure having an electrical terminal adjacent to a surface of the redistribution structure and a seed layer covering a side surface of the electrical terminal;
an electrical connection disposed on a first surface of the electrical terminal, wherein the electrical terminal comprises a pad portion connected to the electrical connection and a trace portion connected to the pad portion; and
an interface between the trace portion and the pad portion;
wherein the seed layer extends to the first surface of the electrical terminal and wherein the interface is concave toward the electrical connection.

2. The semiconductor device package of claim 1, wherein the electrical terminal comprises a second surface adjacent to and angled with respect to the side surface.

3. The semiconductor device package of claim 2, wherein the seed layer is disposed on the second surface of the electrical terminal.

4. The semiconductor device package of claim 2, wherein the redistribution structure comprises a first dielectric layer having a first surface and a second surface opposite to the first surface and a second dielectric layer stacked on the second surface of the first dielectric layer, and wherein the first surface of the electrical terminal is adjacent to the first surface of the first dielectric layer and the second surface of the electrical terminal is arranged on the second surface of the first dielectric layer.

5. The semiconductor device package of claim 1, wherein the redistribution structure comprises a first dielectric layer having a first surface and a second surface opposite to the first surface and a second dielectric layer stacked on the second surface of the first dielectric layer, and wherein the interface is located between the first surface and the second surface of the first dielectric layer.

6. The semiconductor device package of claim 1, wherein the first surface of the electrical terminal is recessed with respect to the surface of the redistribution structure.

7. The semiconductor device package of claim 4, wherein the seed layer extends from the second surface of the first dielectric layer to the first surface of the first dielectric layer.

8. The semiconductor device package of claim 1, wherein a side surface of the pad portion and a side surface of the trace portion are covered by the seed layer.

9. The semiconductor device package of claim 8, wherein a surface of the trace portion, which is adjacent to and angled with respect to the side surface, is covered by the seed layer.

10. A semiconductor device package, comprising:
a redistribution structure;
an electrical terminal arranged in the redistribution structure and adjacent to a surface of the redistribution structure, wherein the electrical terminal comprises a pad portion exposed from the surface of the redistribution structure and a trace portion connected to the pad portion;
a seed layer between the redistribution structure and the electrical terminal and extending to the surface of the redistribution structure; and
an interface between the trace portion and the pad portion, wherein the interface is concave toward a surface of the pad which is exposed from the surface of the redistribution structure.

11. The semiconductor device package of claim 10, wherein the seed layer is configured to cover a side surface of the electrical terminal.

12. The semiconductor device package of claim 10, wherein the electrical terminal comprises a first surface exposed from the surface of the redistribution structure.

13. The semiconductor device package of claim 12, wherein the redistribution structure comprises a first dielectric layer having a first surface and a second surface opposite to the first surface and a second dielectric layer stacked on the second surface of the first dielectric layer, and wherein the first surface of the electrical terminal is adjacent to the first surface of the first dielectric layer and a second surface of the electrical terminal is arranged on the second surface of the first dielectric layer.

14. The semiconductor device package of claim 13, wherein the seed layer extends from the second surface of the electrical terminal to the first surface of the electrical terminal and covers a side surface of the electrical terminal.

15. The semiconductor device package of claim 12, further comprising an electrical connection disposed on the first surface of the electrical terminal.

16. The semiconductor device package of claim 10, wherein the redistribution structure comprises a first dielectric layer having a first surface and a second surface opposite to the first surface and a second dielectric layer stacked on the second surface of the first dielectric layer, and wherein the interface is located between the first surface and the second surface of the first dielectric layer.

* * * * *